United States Patent
Zhu et al.

(10) Patent No.: US 9,691,624 B2
(45) Date of Patent: Jun. 27, 2017

(54) METHOD FOR MANUFACTURING FIN STRUCTURE

(71) Applicant: Institute of Microelectronics, Chinese Academy of Sciences, Beijing (CN)

(72) Inventors: Huilong Zhu, Poughkeepsie, NY (US); Miao Xu, Beijing (CN); Jun Luo, Beijing (CN); Chunlong Li, Beijing (CN); Guilei Wang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/442,890

(22) PCT Filed: Dec. 14, 2012

(86) PCT No.: PCT/CN2012/086657
§ 371 (c)(1),
(2) Date: May 14, 2015

(87) PCT Pub. No.: WO2014/082350
PCT Pub. Date: Jun. 5, 2014

(65) Prior Publication Data
US 2015/0294879 A1    Oct. 15, 2015

(30) Foreign Application Priority Data
Nov. 30, 2012    (CN) .......................... 2012 1 0505449

(51) Int. Cl.
*H01L 21/336* (2006.01)
*H01L 21/84* (2006.01)
(Continued)

(52) U.S. Cl.
CPC .. *H01L 21/30625* (2013.01); *H01L 21/31053* (2013.01); *H01L 21/31105* (2013.01);
(Continued)

(58) Field of Classification Search
CPC ......... H01L 21/82; H01L 21/30; H01L 21/31; H01L 29/66; H01L 29/10
(Continued)

(56) References Cited

U.S. PATENT DOCUMENTS 6,451,702 B1 *   9/2002   Yang .................. H01L 27/1446
                                               257/E27.129
7,955,964 B2 *   6/2011   Wu ................... H01L 21/76883
                                               438/587
(Continued)

FOREIGN PATENT DOCUMENTS

CN          1399309          2/2003
CN          1399309 A   *    2/2003
(Continued)

OTHER PUBLICATIONS

English translation (Machine) of CN1399309A, Lu Wenbin, Jul. 27, 2001.*

(Continued)

*Primary Examiner* — Allen Parker
*Assistant Examiner* — Sheikh Maruf
(74) *Attorney, Agent, or Firm* — McDermott Will & Emery LLP (57) ABSTRACT

Provided is a method for manufacturing a fin structure. The method may include forming an initial fin on a substrate, forming a dielectric layer on the substrate to cover the initial fin, planarizing the dielectric layer by sputtering, and further etching the dielectric layer back to expose a portion of the initial fin, wherein the exposed portion serves as a fin.

10 Claims, 11 Drawing Sheets

(51) Int. Cl.
*H01L 21/306* (2006.01)
*H01L 21/8234* (2006.01)
*H01L 21/3105* (2006.01)
*H01L 21/311* (2006.01)
*H01L 29/10* (2006.01)
*H01L 29/66* (2006.01)

(52) U.S. Cl.
CPC .... *H01L 21/823431* (2013.01); *H01L 21/845* (2013.01); *H01L 29/1054* (2013.01); *H01L 29/66545* (2013.01); *H01L 29/66795* (2013.01)

(58) Field of Classification Search
USPC ........ 438/283, 589, 692, 299, 478; 257/339, 257/402, 410, 190–192, 75–77, E21.409
See application file for complete search history.

(56) References Cited

U.S. PATENT DOCUMENTS

| | | | | |
|---|---|---|---|---|
| 2002/0197880 A1* | 12/2002 | Niimi | ............... | H01L 21/28185 438/763 |
| 2004/0077148 A1* | 4/2004 | Lee | ............... | H01L 21/26586 438/302 |
| 2004/0262687 A1* | 12/2004 | Jung | ............... | H01L 21/84 257/347 |
| 2005/0233525 A1* | 10/2005 | Yeo | ............... | H01L 29/785 438/283 |
| 2006/0011977 A1* | 1/2006 | Kondo | ............. | H01L 29/66795 257/347 |
| 2006/0063334 A1* | 3/2006 | Donze | ............. | H01L 29/861 438/268 |
| 2006/0110865 A1* | 5/2006 | Liu | ............... | H01L 21/265 438/151 |
| 2008/0185691 A1* | 8/2008 | Cheng | ............... | H01L 29/0649 257/656 |
| 2010/0252816 A1* | 10/2010 | Ko | ............... | H01L 29/66818 257/24 |
| 2012/0153387 A1 | 6/2012 | Murthy et al. | | |
| 2013/0040448 A1* | 2/2013 | Yang | ............... | H01L 21/76838 438/585 |
| 2013/0082348 A1* | 4/2013 | Cai | ............... | H01L 21/84 257/529 |
| 2013/0113026 A1* | 5/2013 | Huang | ............... | H01L 29/785 257/288 |
| 2014/0061734 A1* | 3/2014 | Basker | ............... | H01L 29/785 257/288 |
| 2014/0145246 A1* | 5/2014 | Ning | ............... | H01L 29/812 257/280 |
| 2014/0170839 A1* | 6/2014 | Brunco | ............. | H01L 29/66795 438/479 |
| 2014/0217508 A1* | 8/2014 | Chang | ............... | H01L 29/861 257/350 |
| 2014/0332815 A1* | 11/2014 | Basker | ............... | H01L 29/785 257/66 |

FOREIGN PATENT DOCUMENTS

| | | |
|---|---|---|
| CN | 2399309 | 2/2003 |
| CN | 101236995 | 8/2008 |
| CN | 102208443 A | 10/2011 |

OTHER PUBLICATIONS

Office Action issued Dec. 21, 2015, by the Chinese Patent Office for corresponding Chinese Application No. 201210505449.4 (in Chinese and English).

International Search Report for related International Patent Application No. PCT/CN2012/086657, mailed Aug. 22, 2013.

Office Action issued Jun. 24, 2016, by the Chinese Patent Office for corresponding Chinese Application No. 201210505449.4 (in Chinese and English).

Office Action issued Sep. 9, 2016, by the Chinese Patent Office for corresponding Chinese Application No. 201210505449.4 (in Chinese and English).

\* cited by examiner

METHOD FOR MANUFACTURING FIN STRUCTURE

CROSS-REFERENCE TO RELATED APPLICATION(S)

This application is a U.S. national phase application of PCT Application No. PCT/CN2012/086657, filed on Dec. 14, 2012, entitled "METHOD FOR MANUFACTURING FIN STRUCTURE," which claims priority to Chinese Application No. 201210505449.4, filed on Nov. 30, 2012. Both the PCT Application and the Chinese Application are incorporated herein by reference in their entireties.

TECHNICAL FIELD

The present disclosure relates to the semiconductor field, and more specifically, to a method for manufacturing a fin structure.

BACKGROUND

A planarization process such as Chemical Mechanical Polishing (CMP) is generally used in semiconductor processes to obtain a relatively planar surface. However, in a case where a material layer is planarized by CMP, it is difficult to control a surface flatness of the material layer after CMP to be in a range of, e.g., several nanometers, if a relatively thick portion thereof is needed to be ground.

SUMMARY

The present disclosure aims to provide, among others, method for manufacturing a fin structure.

According to an aspect of the present disclosure, there is provided a method for manufacturing a fin structure, comprising: forming an initial fin on a substrate; forming a dielectric layer on the substrate to cover the initial fin; planarizing the dielectric layer by sputtering; and further etching the dielectric layer back to expose a portion of the initial fin, wherein the exposed portion serves as a fin.

BRIEF DESCRIPTION OF THE DRAWINGS

The above and other objects, features, and advantages of the present disclosure will become more apparent from following descriptions on embodiments thereof with reference to attached drawings, in which.

DETAILED DESCRIPTION

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to embodiments of the present disclosure, a material layer may be planarized by sputtering of, e.g., Ar or N plasma. Due to such planarization by sputtering, instead of conventional planarization by CMP, it is possible to achieve a relatively flat surface of the material layer. The material layer may comprise a variety of material layers used in semiconductor manufacture processes, for example, including but not limited to, an insulator material layer, a semiconductor material layer and a conductor material layer.

In an embodiment, the concept of the present disclosure is applicable to Fin Field Effect Transistors (FinFETs).

In general, a FinFET may be manufactured as follows. For example, an initial fin may be formed on a substrate. Subsequently, a dielectric layer may be deposited on the substrate to cover the initial fin. This dielectric layer may be planarized by, for example, Chemical Mechanical Polishing (CMP). Next, the dielectric layer may be etched back to form an isolation layer, and a portion of the initial fin is thus exposed. The exposed portion of the initial fin may then serve as a fin for a final device. However, it is difficult for the CMP process to control the surface flatness within several nanometers, and therefore the start-point surface, from which the etching-back process is started, is not flat enough, resulting in variations in height of fins, if multiple, across the wafer.

According to an embodiment of the present disclosure, after the dielectric layer is deposited, the dielectric layer maybe planarized by plasma sputtering. In this way, the CMP may not be used at all or the CMP may be used at a less dose as compared with the conventional technology. Therefore, the consistency of the start-point surface of the etching-back process on the dielectric layer can be improved.

The technology of the present disclosure can be implemented in various ways, some of which are exemplified in the following.

Figure 1:
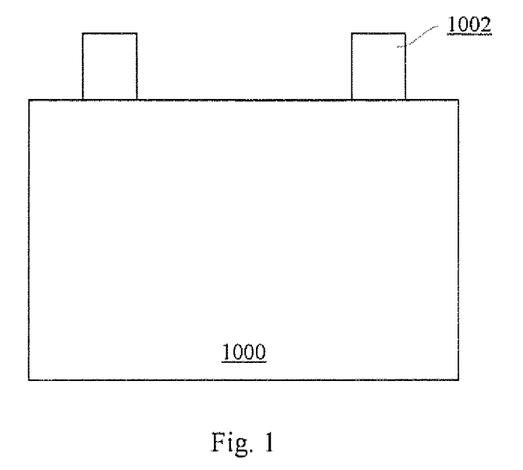
FIGS. 1-13 are schematic views illustrating a flow of manufacturing a fin structure in accordance with an embodiment of the present disclosure.

As shown in FIG. 1, a substrate 1000 is provided. The substrate 1000 may comprise various forms of substrates, e.g., including but not limited to, a bulk semiconductor substrate such as a bulk Si substrate, a Semiconductor-on-Insulator (SOI) substrate, a SiGe substrate, or the like. In the following descriptions, the bulk Si substrate is described by way of example.

Figure 2:
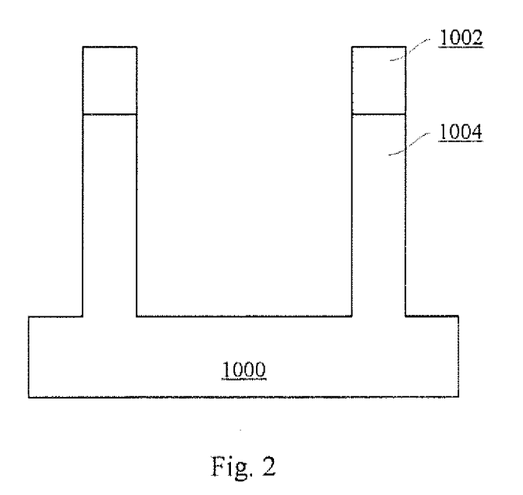

The substrate 1000 may be patterned to form initial fins thereon. For example, this may be done as follows. Specifically, patterned photoresist 1002 may be formed on the substrate 1000 according to the design. The photoresist 1002 is typically patterned into a series of parallel, equally spaced lines. Subsequently, as shown in FIG. 2, the substrate 1000 may be etched by, e.g., Reactive Ion Etching (RIE), with the patterned photoresist as a mask, in order to form the initial fins 1004. Then, the photoresist 1002 may be removed.

It should be noted that the shape of trenches (between the fins) formed by etching is not necessarily a regular rectangle as shown in FIG. 2, but may be tapered from top down. Further, positions and the number of the initial fins formed are not limited to the example as shown in FIG. 2.

Furthermore, the initial fins are not limited to being formed by directly patterning the substrate. For example, the initial fins may be formed by epitaxially growing another semiconductor layer on the substrate and then patterning the other semiconductor layer. If there is sufficient etching selectivity between the other semiconductor layer and the substrate, the patterning of the initial fins may be stopped at the substrate, so as to implement a more precise control on a height of the initial fins.

Therefore, in the context of the present disclosure, the expression "forming an initial fin on a substrate" may comprise forming the fin on the substrate in any suitable manner.

An isolation layer may be formed on the substrate after the initial fins are formed by the above process.

Figure 3:
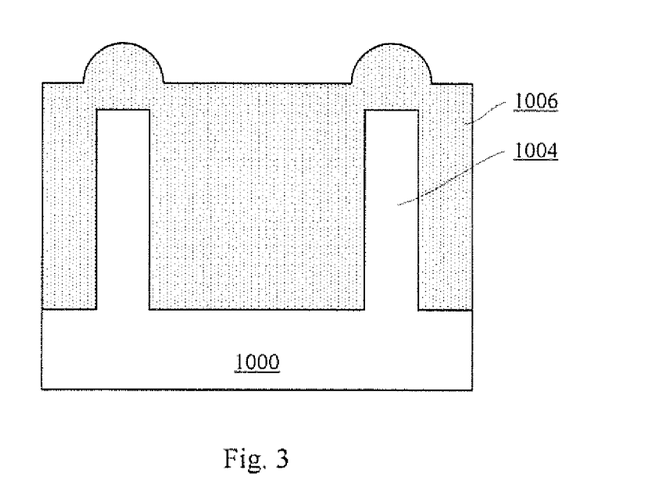

Specifically, as shown in FIG. 3, a dielectric layer 1006 may be formed on the substrate by e.g. deposition, so as to cover the formed initial fins 1004. For example, the dielectric layer 1006 may comprise oxide such as silicon oxide.

Figure 4:
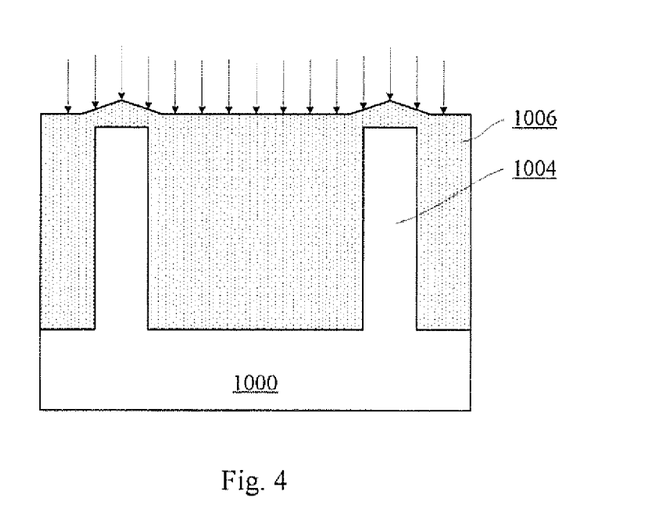

Subsequently, as shown in FIG. 4, the dielectric layer 1006 may be subjected to sputtering so as to be planarized. For example, plasma such as Ar or N plasma may be used for sputtering. Here, sputtering parameters, such as sputtering power and atmospheric pressure, may be controlled according to a cutting rate of the dielectric layer 1006 by the plasma sputtering, so as to determine a time period for the plasma sputtering. Thus, the plasma sputtering can be performed for a certain time period so as to sufficiently smooth the surface of the dielectric layer 1006. On the other hand, in the example as shown in FIG. 4, the plasma sputtering may be stopped before reaching the top surface of the initial fins 1004, so as to avoid excessive damage to the initial fins 1004.

Although FIG. 4 shows microscopic fluctuations, the top surface of the dielectric layer 1006 actually has a sufficient flatness, with fluctuations thereof controlled within, for example, several nanometers.

According to another embodiment of the present disclosure, the dielectric layer 1006 may be subjected to some CMP after planarization by sputtering, if necessary.

Figure 5:
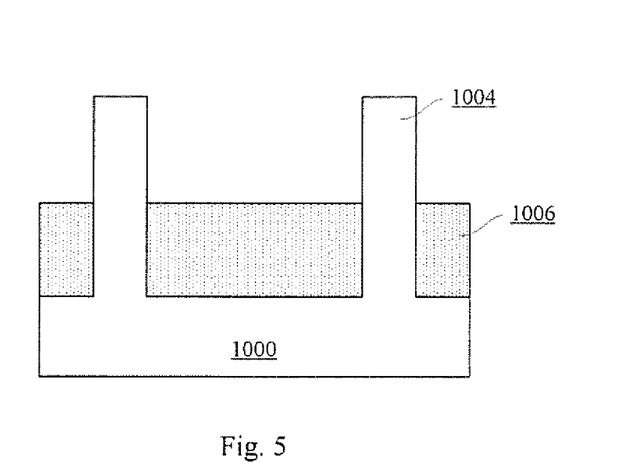

After the surface of the dielectric layer 1006 is sufficiently smoothed by the plasma sputtering, the dielectric layer 1006 may be etched back by e.g. RIE to expose a portion of the respective initial fins 1004, as shown in FIG. 5. The exposed portion may be subsequently used as a fin for a final device. The isolation layer may be constituted by the remaining dielectric layer 1006. Since the surface of the dielectric layer 1006 becomes smooth by sputtering before the etching-back, the surface of the isolation layer 1006 may keep substantially consistent across the substrate after the etching-back.

Figure 6:
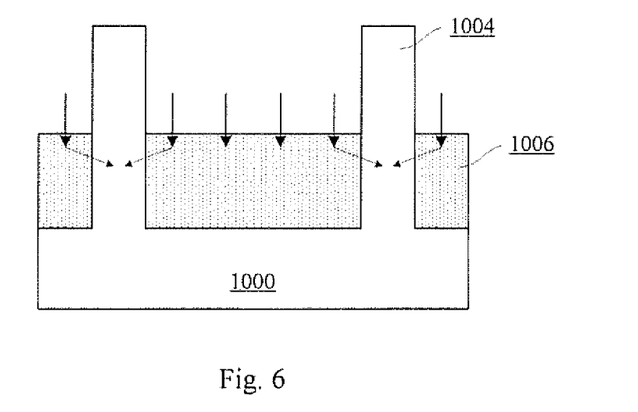
Figure 7:
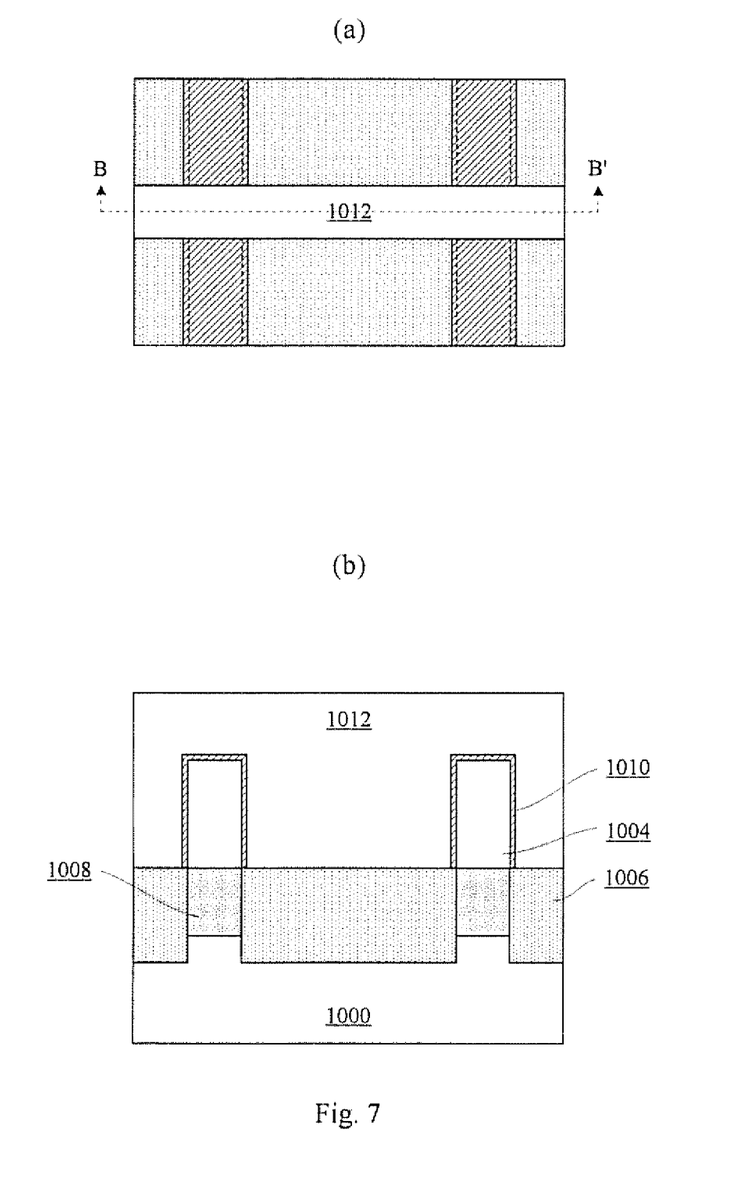

According to an example of the present disclosure, a punch-through stopper (referring to 1008 as shown in FIG. 7) may be formed by implantation in order to improve device performances, as shown by arrows in FIG. 6. For example, p-type impurities such as B, $BF_2$ or In may be implanted for an n-type device; and n-type impurities such as As or P may be implanted for a p-type device. The ion implantation may be carried out in a direction substantially perpendicular to the surface of the substrate. Parameters for the ion implantation may be controlled, so that the punch-through stopper may be formed in a portion of the initial fin which is located below the surface of the isolation layer 1006 and may have a desired doping concentration. It should be noted that a part of dopants (ions or elements) may be scattered from the exposed portions of the initial fins due to a form factor of the initial fins. Thus, it is beneficial to form an abrupt doping distribution in a depth direction. Annealing may be performed to activate the implanted impurities. Such a punch-through stopper may facilitate to reduce leakage between source and drain.

Next, a gate stack across the fin may be formed on the isolation layer 1006. For example, this may be done as follows. Specifically, as shown in FIG. 7 (FIG. 7(b) shows a cross-sectional view taken along line BB' in FIG. 7(a)), a gate dielectric layer 1010 may be formed by e.g. deposition. For example, the gate dielectric layer 1010 may comprise oxide with a thickness of about 0.8-1.5 nm. In the example as shown in FIG. 7, the gate dielectric layer 1010 is shown in a "Π" shape. However, the gate dielectric layer 1010 may also include a portion extending on the top surface of the isolation layer 1006.

Then, a gate conductor layer 1012 may be formed by e.g. deposition. For example, the gate conductor layer 1012 may comprise polysilicon. The gate conductor layer 1012 may fill the gaps between the fins, and then planarized by, for example, CMP. Next, the gate conductor layer 1012 may be patterned in order to form the gate stack. In the example of FIG. 7, the gate conductor layer 1012 is patterned into a bar intersecting the fins. According to another embodiment, the gate dielectric layer 1010 may be further patterned with the patterned gate conductor layer 1012 as a mask.

After the gate conductor is patterned, halo implantation and extension implantation may be performed with the gate conductor as a mask, for example.

Figure 8:
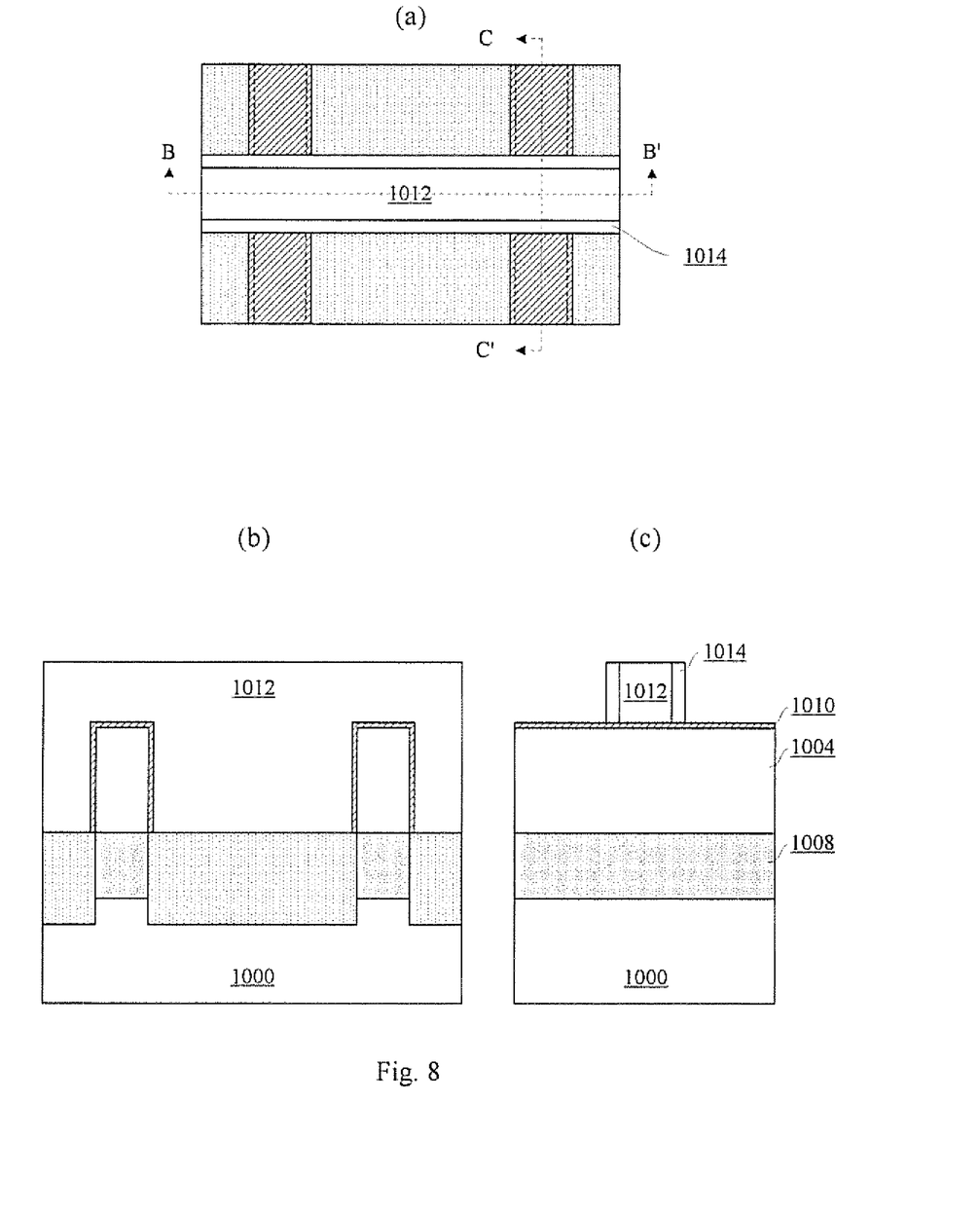

Next, as shown in FIG. 8 (FIG. 8(b) shows a cross-sectional view along line BB' in FIG. 8(a), and FIG. 8(c) shows a cross-sectional view along line CC' in FIG. 8(a)), a spacer 1014 may be formed on side walls of the gate conductor layer 1012. For example, nitride such as silicon nitride with a thickness of about 5-20 nm may be formed by deposition, and then subjected to RIE to form the spacer 1014. There are various methods to form the spacer, and detailed descriptions thereof are omitted here. When the trenches between the fins are tapered from top down (which is a common situation due to characteristics of etching), the spacer 1014 may have substantially no portion formed on side walls of the fins.

After the spacer is formed, source/drain (S/D) implantation may be performed with the gate conductor and the spacer as a mask. Subsequently, annealing may be performed to activate the implanted ions, so as to form source/drain regions, resulting in FinFETs.

In the embodiment as illustrated above, the gate stack is directly formed after the fins are formed. However, the present disclosure is not limited to this. For example, the present disclosure is also applicable to the gate last process. Further, the strained source/drain technique may also be incorporated.

According to another embodiment of the present disclosure, the gate dielectric layer 1010 and the gate conductor layer 1012 formed in FIG. 7 may be a sacrificial gate dielectric layer and a sacrificial gate conductor layer, respectively. Next, the spacer 1014 may be formed in the way as described above in conjunction with FIG. 8.

Figure 9:
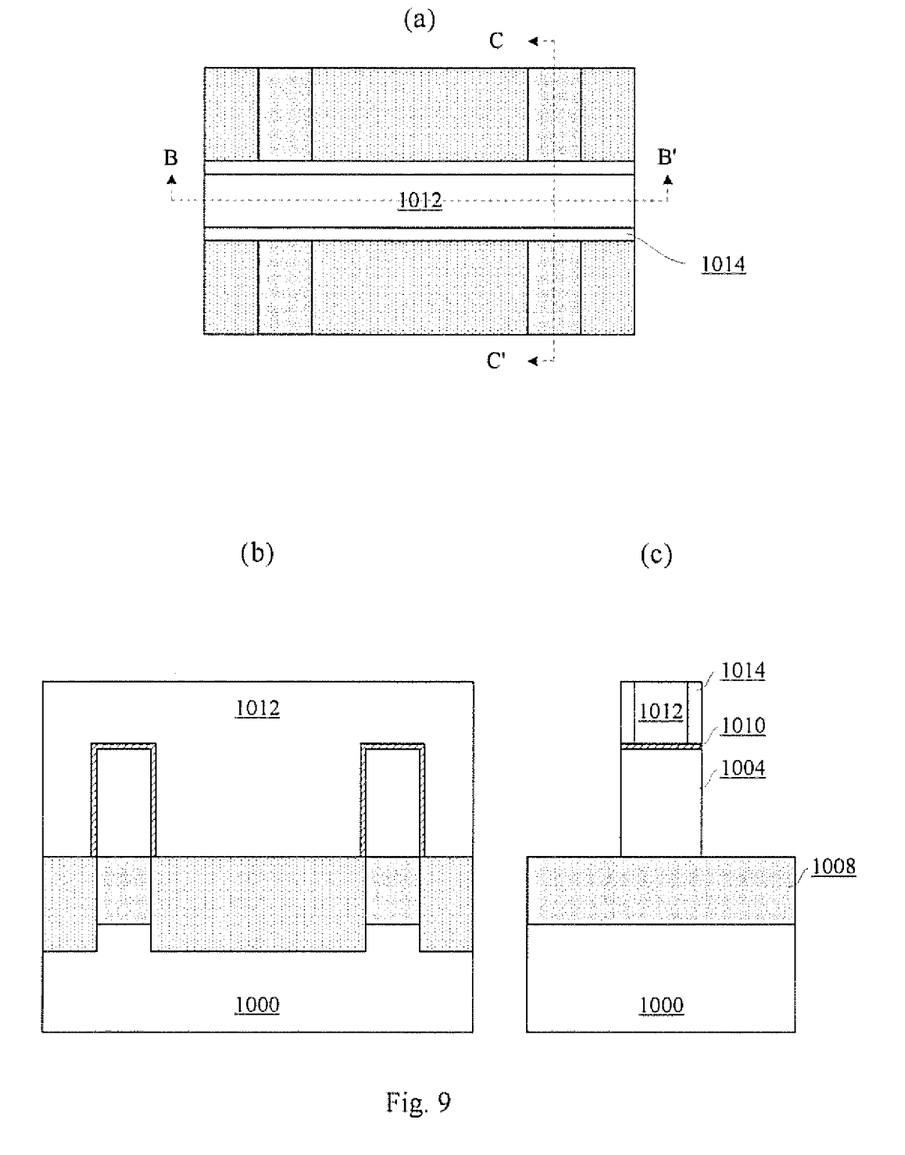

Then, as shown in FIG. 9 (FIG. 9(b) shows a cross-sectional view along line BB' of FIG. 9(a), and FIG. 9(c) shows a cross-sectional view along line CC' of FIG. 9(a)), exposed portions of the sacrificial gate dielectric layer 1010 may be selectively removed (by e.g. RIE). In a case where both the sacrificial gate dielectric layer 1010 and the isolation layer 1006 comprise oxide, the RIE of the sacrificial gate dielectric layer 1010 may have substantially no impact on the isolation layer 1006 because the sacrificial gate dielectric layer 1010 is relatively thin. This operation is not required any more if the sacrificial gate dielectric layer has been further patterned with the sacrificial gate conductor as a mask in the process of forming the sacrificial gate stack as described above.

Next, portions of the initial fin 1004 which are exposed due to the removal of the sacrificial dielectric layer 1010 may be selectively removed (by e.g. RIE). The etching of those portions of the initial fin 1004 may be carried out until the punch-through stopper 1008 is exposed. Due to the presence of the sacrificial gate stack (the sacrificial gate dielectric layer, the sacrificial gate conductor and the spacer), a portion of the initial fin 1004 may be left under the sacrificial gate stack.

Figure 10:
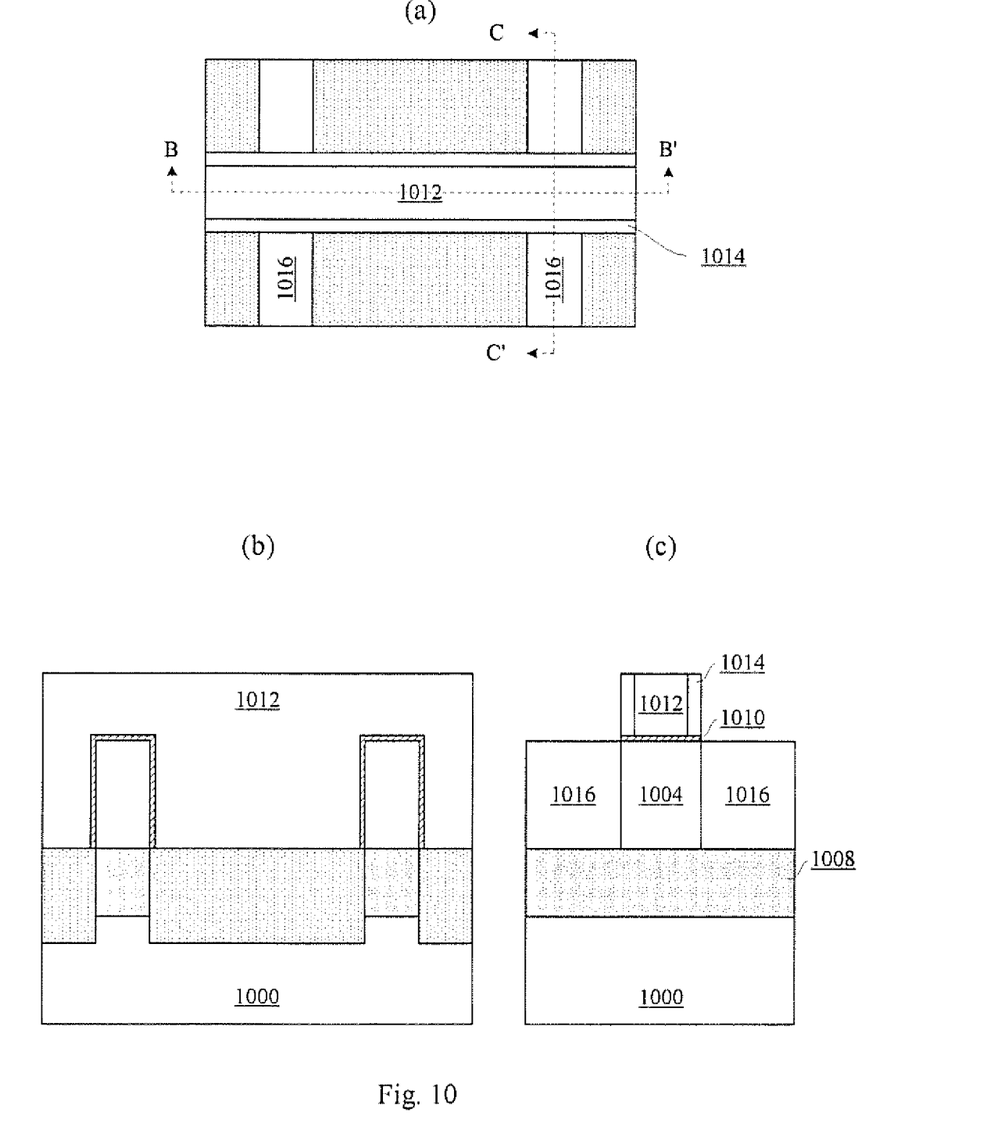

Subsequently, as shown in FIG. 10 (FIG. 10(*b*) shows a cross-sectional view along line BB' of FIG. 10(*a*), and FIG. 10(*c*) shows a cross-sectional view along the line CC' of FIG. 10(*a*)), a semiconductor layer 1016 may be formed on exposed portions of the initial fin by e.g. epitaxy. Then, source/drain regions may be formed in the semiconductor layer 1016. According to an embodiment of the present disclosure, the semiconductor layer 1016 may be doped in-situ while being grown. For example, n-type in-situ doping may be performed for an n-type device; while p-type in-situ doping may be performed for a p-type device. Moreover, in order to further improve the performances, the semiconductor layer 1016 may comprise a material different from that of the fin 1004 to apply strain to the fin 1004 (in which a channel of the device will be formed). For example, in a case where the fin 1004 comprises Si, the semiconductor layer 1016 may comprise Si:C (where an atomic percentage of C is e.g. about 0.2-2%) to apply tensile stress for the n-type device, or SiGe (where an atomic percentage of Ge is e.g. about 15-75%) to apply compressive stress for the p-type device.

In a case where the sacrificial gate conductor layer 1012 comprises polysilicon, the growth of the semiconductor layer 1016 may occur on the top surface of the sacrificial gate conductor 1012. This is not shown in the drawings.

Figure 11:
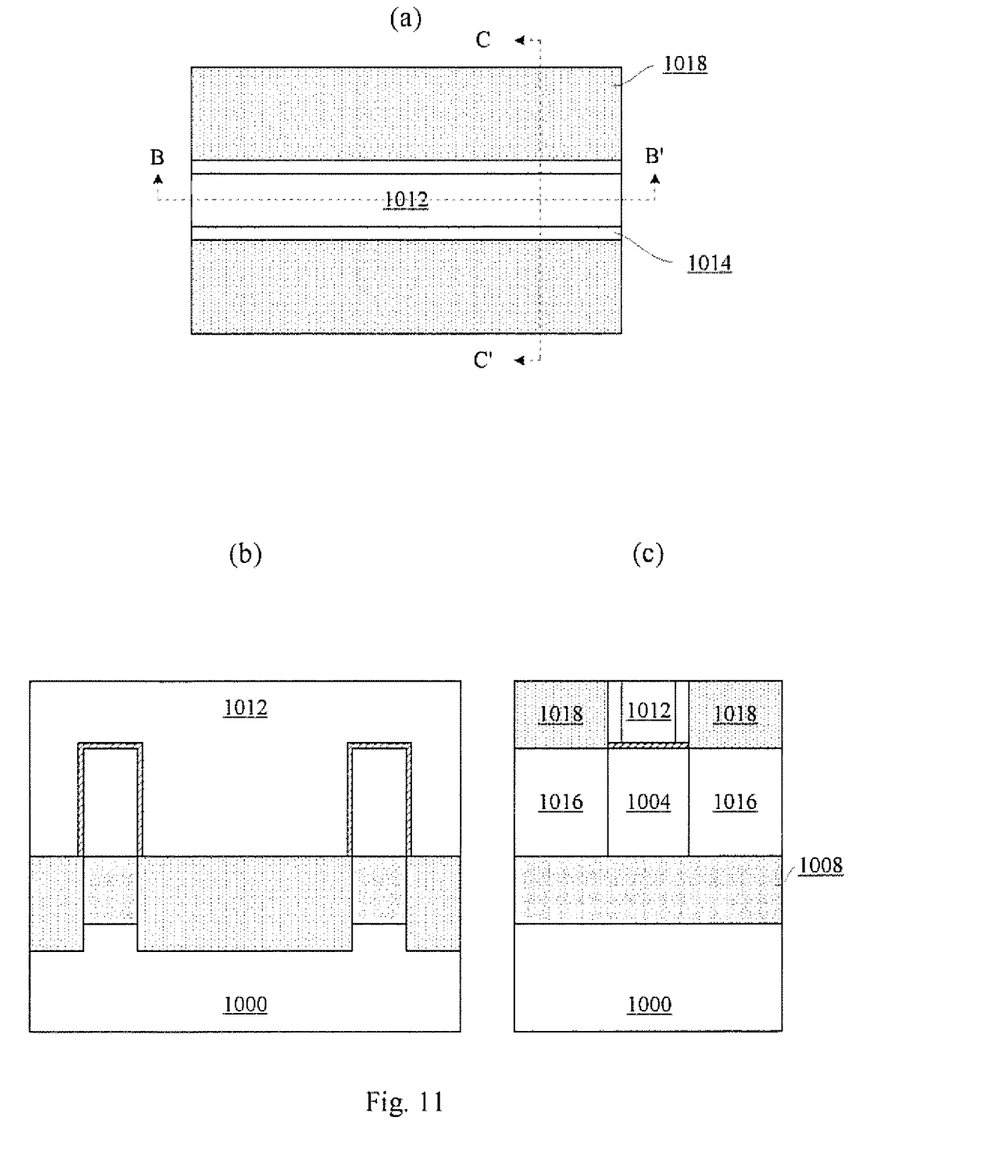

Next, as shown in FIG. 11 (FIG. 11(*b*) shows a cross-sectional view along line BB' of FIG. 11(*a*)), a further dielectric layer 1018 may be formed by e.g. deposition. The dielectric layer 1018 may comprise e.g. oxide. Subsequently, the dielectric layer 1018 may be planarized by e.g. CMP. The CMP may be stopped at the spacer 1014, so as to expose the sacrificial gate conductor 1012.

Figure 12:
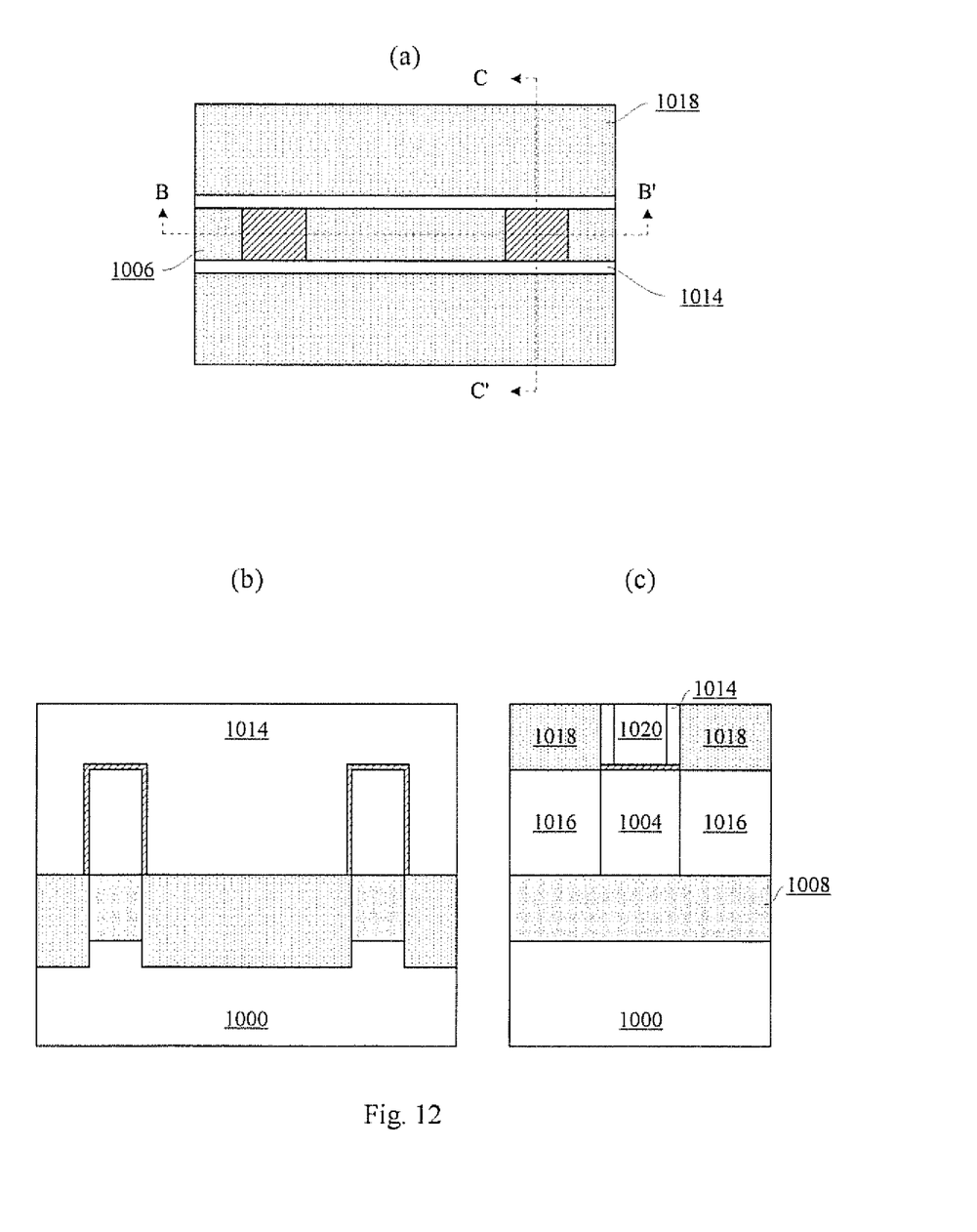

Then, as shown in FIG. 12 (FIG. 12(*b*) shows a cross-sectional view along line BB' of FIG. 12(*a*), and FIG. 12(*c*) shows a cross-sectional view along line CC' of FIG. 12(*a*)), the sacrificial gate conductor 1012 may be selectively removed by e.g. TMAH solution, so as to form a gap 1020 inside the spacer 1014. According to another example, the sacrificial gate dielectric layer 1010 may be further removed.

Figure 13:
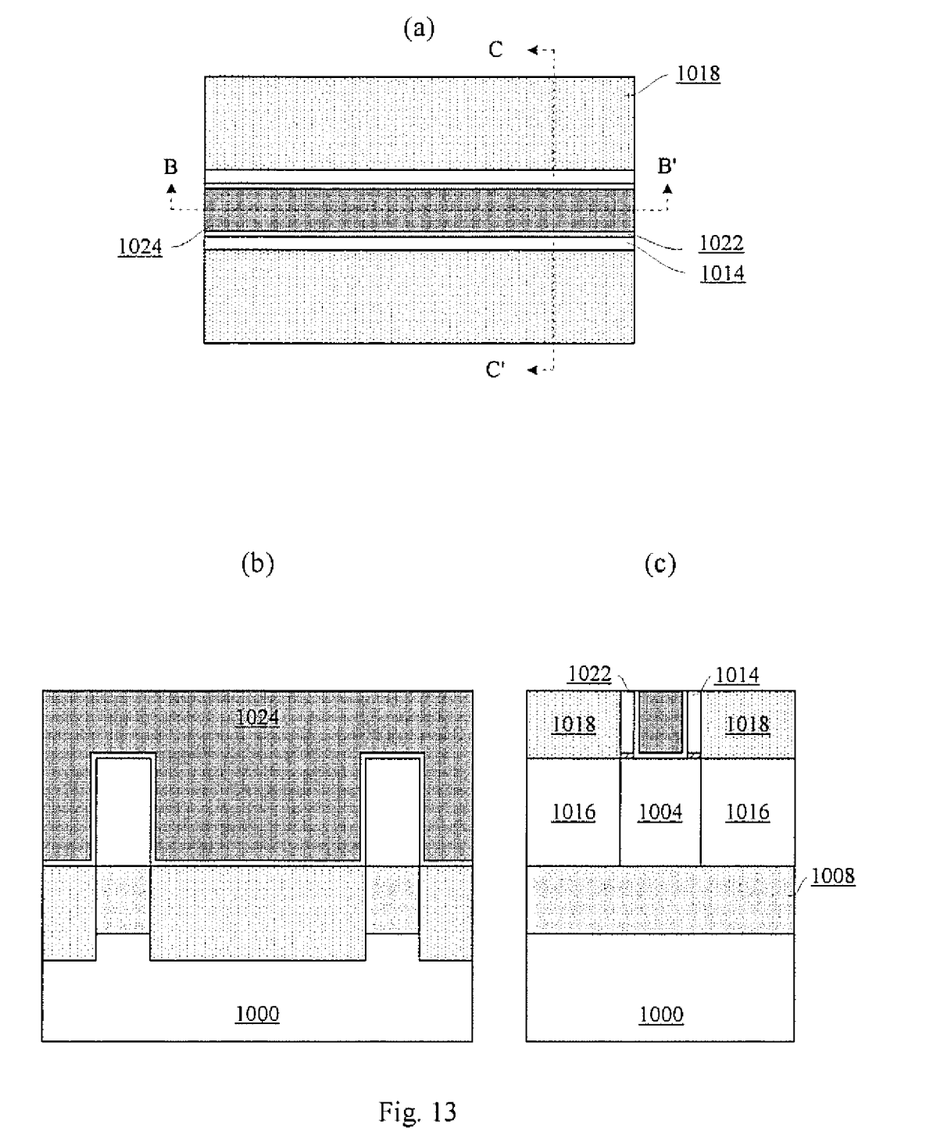

Next, as shown in FIG. 13 (FIG. 13(*b*) shows a cross-sectional view along line BB' of FIG. 13(*a*), and FIG. 13(*c*) shows a cross-sectional view along line CC' of FIG. 13(*a*)), a gate dielectric layer 1022 and a gate conductor layer 1024 may be formed in the gap 1020, so as to form a final gate stack. The gate dielectric layer 1022 may comprise a high-K gate dielectric, e.g. $HfO_2$, with a thickness of about 1-5 nm. The gate conductor layer 1024 may comprise a metal gate conductor. Preferably, a work function adjustment layer (not shown) may also be formed between the gate dielectric layer 1022 and the gate conductor layer 1024.

Figure 14:
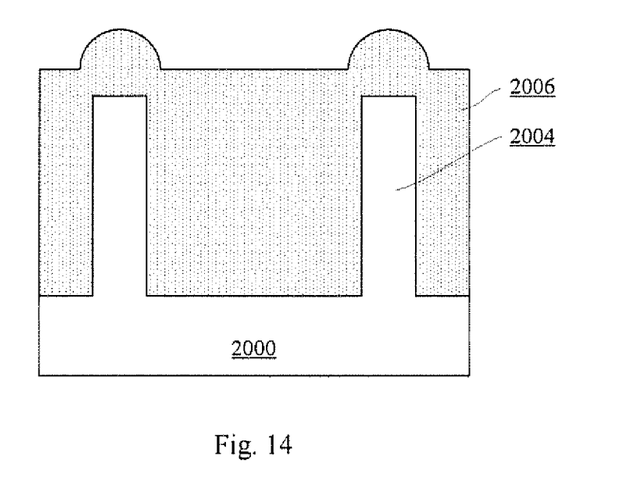
FIGS. 14 and 15 are schematic views illustrating some steps in a flow of manufacturing a fin structure in accordance with another embodiment of the present disclosure.
Figure 15:
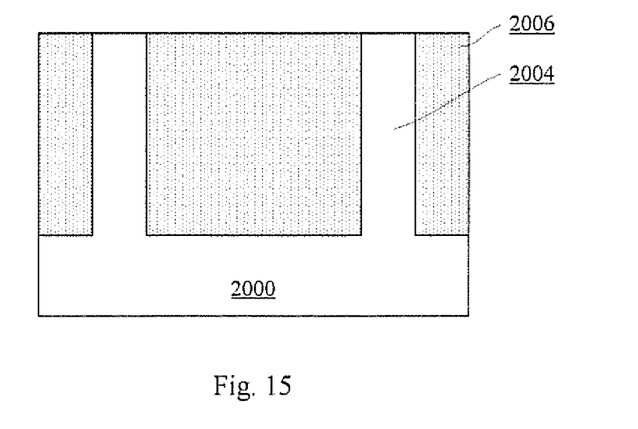

According to another embodiment of the present disclosure, as shown in FIG. 14, initial fins 2004 are formed on a substrate 2000. After a dielectric layer 2006 is formed on the substrate 2000 to cover the initial fins 2004, the dielectric layer 2006 may be planarized by sputtering. In this regard, reference may be made to the above descriptions with reference to FIGS. 1-4, for example. Here, the difference consists in that the sputtering is performed until portions of the initial fins at a top end thereof are removed, as shown in FIG. 15. The sputtering parameters, such as sputtering power and atmospheric pressure, may be controlled until the sputtering reaches the top ends of the respective initial fins 2004. In order to remove damages of the initial fins 2004 caused by the sputtering, an annealing or etching-back may be performed on the top ends of the initial fins 2004 after the sputtering.

The subsequent processes may be performed in the way described above with reference to FIGS. 5-13.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. A method for manufacturing a fin structure, comprising the steps of:
    forming an initial fin on a substrate;
    forming a dielectric layer on the substrate to cover the initial fin;
    planarizing the dielectric layer by sputtering so that after sputtering the dielectric layer has a top surface substantially planarized with a protrusion on top of the initial fin, and wherein after sputtering the top surface of the dielectric layer is at a level higher than or substantially the same as a top surface of the initial fin; and
    further etching back the dielectric layer to expose a portion of the initial fin, wherein the exposed portion serves as a fin.

2. The method of claim 1, wherein after the sputtering and before the further etching-back, the method further comprises the step of: performing a Chemical Mechanical Polishing process.

3. The method of claim 1, wherein the sputtering is performed until a portion of the initial fin at a top end thereof is removed.

4. The method of claim 3, further comprising the step of: performing an annealing on or etching back the top end of the initial fin to remove plasma induced damages.

5. The method of claim 1, wherein after the further etching-back, the method further comprises the step of: performing ion implantation to form a punch-through stopper in a portion of the initial fin which is located below a surface of the further etched-back dielectric layer.

6. The method of claim 5, wherein in forming the punch-through stopper, n-type implantation is performed for a P-type device, and p-type implantation is performed for an n-type device.

7. The method of claim 5, wherein after the punch-through stopper is formed, the method further comprises the steps of:
   forming a sacrificial gate stack across the fin on the dielectric layer;
   selectively etching the initial fin with the sacrificial gate stack as a mask, until the punch-through stopper layer is exposed;
   forming a semiconductor layer on exposed portions of the initial fin to form source/drain regions; and
   replacing the sacrificial gate stack with a gate stack.

8. The method of claim 7, wherein the semiconductor layer has compressive stress for a p-type device, and has tensile stress for an n-type device.

9. The method of claim 8, wherein the substrate comprises Si, the initial fin is formed by patterning the substrate, and the semiconductor layer comprises SiGe or Si:C.

10. The method of claim 7, wherein the semiconductor layer is doped in-situ while being formed.

\* \* \* \* \*